(12) United States Patent
Kim et al.

(10) Patent No.: US 9,252,193 B2
(45) Date of Patent: Feb. 2, 2016

(54) ORGANIC LIGHT EMITTING DISPLAY DEVICE AND METHOD FOR FABRICATING THE SAME

(71) Applicant: LG DISPLAY CO., LTD., Seoul (KR)

(72) Inventors: Jong Sung Kim, Gyeonggi-do (KR); Ho Jin Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/721,746

(22) Filed: Dec. 20, 2012

(65) Prior Publication Data

US 2014/0001447 A1 Jan. 2, 2014

(30) Foreign Application Priority Data

Jun. 27, 2012 (KR) .................. 10-2012-0068953

(51) Int. Cl.
*H01L 27/32* (2006.01)
*H01L 51/56* (2006.01)
*H01L 51/52* (2006.01)

(52) U.S. Cl.
CPC ............ *H01L 27/3213* (2013.01); *H01L 51/52* (2013.01); *H01L 51/56* (2013.01); *H01L 27/3216* (2013.01); *H01L 27/3218* (2013.01)

(58) Field of Classification Search
CPC ..... H01L 27/32; H01L 51/56; H01L 27/3202; H01L 27/3204; H01L 51/50; H01L 51/52
USPC ............................................. 257/40; 438/35
See application file for complete search history.

(56) References Cited

U.S. PATENT DOCUMENTS

| 8,492,754 B2* | 7/2013 | Nishiyama et al. ............. 257/40 |
| 2007/0075312 A1 | 4/2007 | Chin et al. |
| 2009/0115326 A1* | 5/2009 | Chan et al. .................... 313/504 |
| 2009/0165846 A1* | 7/2009 | Johannes et al. ............. 136/256 |
| 2011/0220921 A1* | 9/2011 | Tamura et al. .................. 257/88 |
| 2012/0032207 A1 | 2/2012 | Nishiyama et al. |
| 2012/0098011 A1 | 4/2012 | Choi et al. |

(Continued)

FOREIGN PATENT DOCUMENTS

| CN | 102281660 A | 12/2011 |
| CN | 102456841 A | 5/2012 |

OTHER PUBLICATIONS

Korean Notice of Allowance issued in Korean Application No. 10-2012-0068953 on Apr. 22, 2014.

(Continued)

*Primary Examiner* — Evan Pert
(74) *Attorney, Agent, or Firm* — Morgan, Lewis & Bockius LLP

(57) ABSTRACT

An OLED device includes a substrate including first through fourth sub-pixel regions arranged in a quad type, a first electrode disposed on each of the first through fourth sub-pixel regions, a first functional layer disposed on all the first through fourth sub-pixel regions and configured to emit first color light, a second functional layer formed in a stripe shape, which progresses along the second and fourth sub-pixel regions arranged in a row direction, and configured to emit second color light, a third functional layer formed in another stripe shape, which progresses along the third and fourth sub-pixel regions arranged in a column direction, and configured to emit third color light, and a second electrode disposed on the entire surface of the substrate including the first through third functional layers.

10 Claims, 14 Drawing Sheets

(56) References Cited

U.S. PATENT DOCUMENTS

2012/0161111 A1* 6/2012 Chiang et al. .................. 257/40
2012/0218173 A1* 8/2012 Ohta et al. ..................... 345/76
2013/0295707 A1* 11/2013 Deus et al. ..................... 438/46

OTHER PUBLICATIONS

Chinese Office Action issued in Chinese Patent Application No. 201210599278.6 on May 25, 2015.

\* cited by examiner

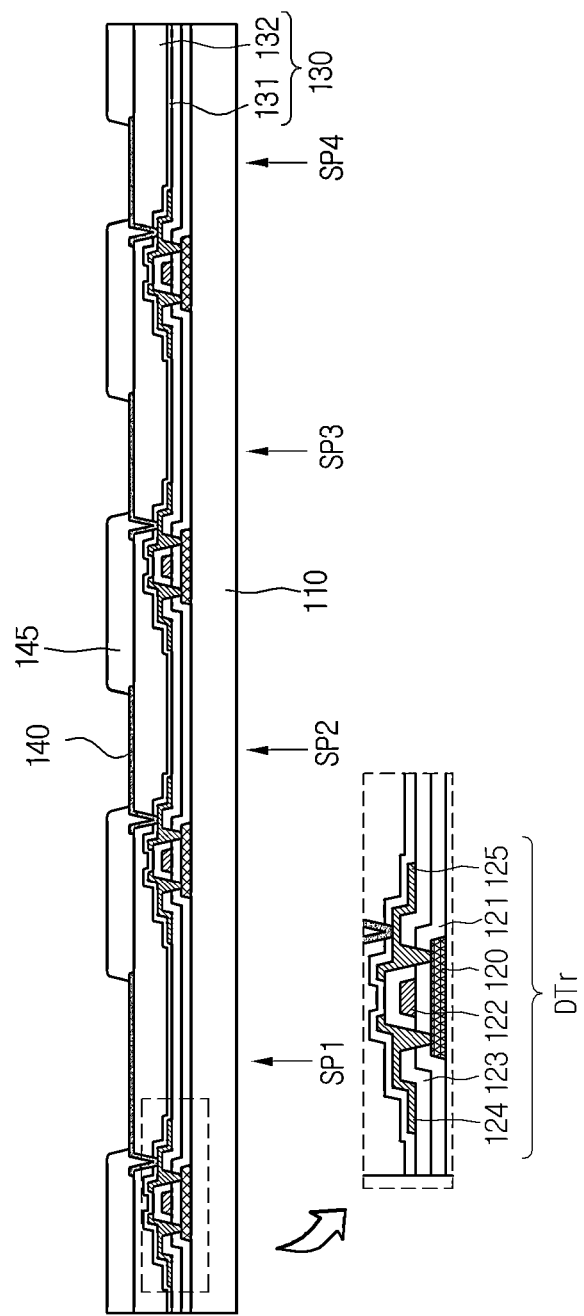

ORGANIC LIGHT EMITTING DISPLAY DEVICE AND METHOD FOR FABRICATING THE SAME

The present application claims the benefit of Korean Patent Application No. 10-2012-0068953 filed in Korea on Jun. 27, 2012, which is hereby incorporated by reference in its entirety.

BACKGROUND OF THE INVENTION

1. Field of the Invention

The present invention relates to an organic light emitting display (OLED) device, and more particularly, to an OLED device adapted to simultaneously enhance visibility and an aperture ratio and a method of manufacturing the same.

2. Discussion of the Related Art

In general, an OLED device includes a pair of electrodes and a functional layer interposed between the electrodes. Such an OLED device displays an image using a principle of emitting light through the recombination of electron and electric hole, which are applied from the electrodes, in the functional layer.

The OLED device is a self-illuminating display device. In other words, unlike a liquid crystal display device, the OLED device is formed without a backlight unit, and thus may become thinner. Also, the OLED device is adaptable to display high-quality moving pictures because of at least its features of low voltage drive, a wide viewing angle and high speed response.

FIG. 1 is a planar view showing some pixels of an OLED device according to a prior art. Referring to FIG. 1, the OLED device includes a plurality of pixels P. Each pixel P includes first through third sub-pixels, which become red (R), green (G) and blue (B) for displaying red, green and blue colors, respectively. Thus, the OLED device can realize full color. The R, G and B sub-pixels may be arranged in a stripe format with a superior visibility (or high visual recognizability).

However, it is difficult for the arrangement of the stripe format to secure an aperture ratio of at least 30% due to limitations on the fabrication process, more particularly the limitation on a mask fabrication process. In order to secure a desired aperture ratio, there have been attempts to arrange the sub-pixels in a delta format or to modify circuit configuration. Nevertheless, the arrangement of the delta format and the modified circuit configuration deteriorates the visibility (the visual recognizability) even below that of the arrangement of the stripe format.

In view of above, it is necessary for the OLED device to provide a new technical alternative that is able to secure both the aperture ratio and the visibility (or the visual recognizability).

SUMMARY OF THE INVENTION

Accordingly, the present invention is directed to an OLED device that substantially obviates one or more of problems due to the limitations and disadvantages of the related art, and to a method of fabricating the same.

An object of the present invention is to provide an OLED device and a manufacturing method thereof that are adapted to enhance the visibility (or visual recognizability).

Another object of the present invention is to provide an OLED device and a manufacturing method thereof that are adapted to enhance the aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the OLED device includes a substrate including first through fourth sub-pixel regions arranged in a quad type; a first electrode disposed on each of the first through fourth sub-pixel regions; a first functional layer disposed on all the first through fourth sub-pixel regions and configured to emit first color light; a second functional layer formed in a stripe shape, which progresses along the second and fourth sub-pixel regions arranged in a row direction, and configured to emit second color light; a third functional layer formed in another stripe shape, which progresses along the third and fourth sub-pixel regions arranged in a column direction, and configured to emit third color light; and a second electrode disposed on the entire surface of the substrate including the first through third functional layers.

In another aspect, the OLED device fabricating method of the present embodiment includes preparing a substrate including first through fourth sub-pixel regions arranged in a quad type; forming a first electrode on each of the first through fourth sub-pixel regions; forming a first functional layer, which is configured to emit first color light, on all the first through fourth sub-pixel regions; forming a second functional layer, which is configured to emit second color light, in a first stripe shape progressing along the second and fourth sub-pixel regions which are arranged in a row direction; forming a third functional layer, which crosses the second functional layer and is configured to emit third color light, in a second stripe shape progressing along the third and fourth sub-pixel regions which are arranged in a column direction; and forming a second electrode on the entire surface of the substrate including the first through third functional layers.

It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present invention are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this specification, illustrate embodiments of the invention and together with the description serve to explain the invention. In the drawings:

FIGS. 8A through 8E are cross-sectional views illustrating a method of fabricating an OLED device according to the fourth exemplary embodiment of the present invention;

DETAILED DESCRIPTION OF THE PREFERRED EMBODIMENTS

Figure 1:
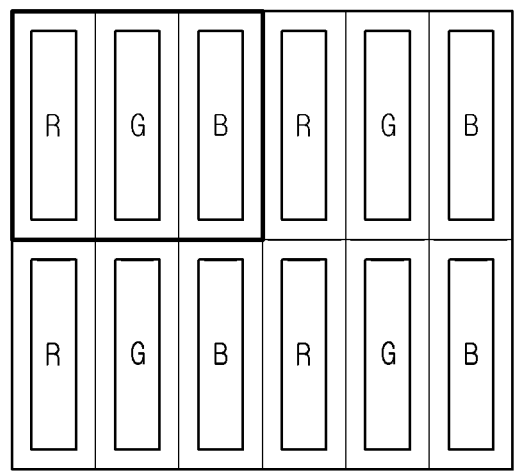
FIG. 1 is a planar view showing some pixels of an OLED device according to a prior art.

Reference will now be made Specifically to the exemplary embodiments of the present invention, examples of which are illustrated in the accompanying drawings. These exemplary embodiments introduced hereinafter are provided as examples in order to convey their spirits to the ordinary skilled person in the art. Therefore, these exemplary embodiments might be embodied in a different shape, so are not limited to these exemplary embodiments described here. In the drawings, the size, thickness and so on of a device may be exaggerated for convenience of explanation. Wherever possible, the same reference numerals will be used throughout this disclosure including the drawings to refer to the same or like parts.

Figure 2:
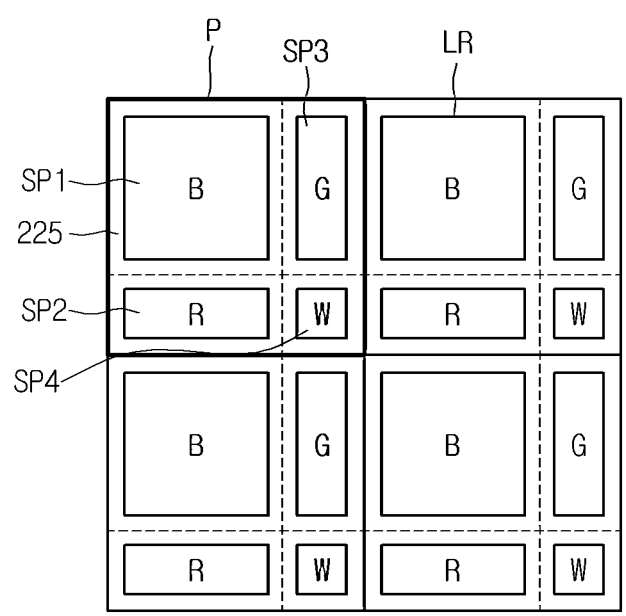
FIG. 2 is a planar view showing some pixels of an OLED device according to a first exemplary embodiment of the present invention.

FIG. 2 is a planar view showing some pixels of an OLED device according to a first exemplary embodiment of the present invention. Referring to FIG. 2, the OLED device includes a plurality of pixels P. Each pixel P includes first through fourth sub-pixels SP1-SP4, which become blue (B), red (R), green (G) and white (W), respectively. As the white sub-pixel W is included in each pixel P, the power consumption of the OLED device may be reduced. In fact, the white sub-pixel W can supplement brightness generated by the blue, red and green sub-pixels B, R and G. Thus, each pixel P can obtain desired brightness even though the drive voltage applied to the sub-pixel is lowered.

The first through fourth sub-pixels SP1-SP4 may be arranged in a quad type within a single pixel P. For example, the first and second sub-pixels SP1 and SP2 may be arranged along a first row and the third and fourth sub-pixels SP3 and SP4 may be arranged along a second row. Alternatively, the first and third sub-pixels SP1 and SP3 may be arranged along the first row and the second and fourth sub-pixels SP2 and SP4 may be arranged along the second row.

The first sub-pixel SP1 corresponding to the blue sub-pixel B may have a larger area than those of the other pixels, i.e., the second through fourth sub-pixels SP2, SP3 and SP4, within a single pixel P. This results from the fact that the blue sub-pixel B has a lower brightness than those of the other sub-pixels displaying different colors from the blue color. In other words, the blue sub-pixel B increases the brightness by expanding its area. Although it is explained that the first sub-pixel SP1 corresponds to the blue sub-pixel B, the first embodiment of the present invention is not limited to this.

The second sub-pixel SP2 may be disposed at a lower side of the first sub-pixel SP1, and the third sub-pixel SP3 may be disposed at a left or right side of the first sub-pixel SP1. The second and third sub-pixels SP2 and SP3 may each have a rectangle shape. These results from the fact that since the first sub-pixel SP1 has a larger area than those of the other sub-pixels within a single pixel region, it is necessary to secure areas for forming the other sub-pixels, more particularly the second and third sub-pixels SP2 and SP3. Also, in order to maximally secure spaces for the formation of the second and third sub-pixels SP2 and SP3, the second and third sub-pixels SP2 and SP3 may become rectangles having major exes progressing in different directions from each other, for example in directions perpendicular to each other, within a single pixel region. If the second sub-pixel SP2 is disposed to have the major axis of a column direction, the third sub-pixel SP3 may be disposed to have the major axis of a row direction. Thus, the first and third sub-pixels SP1 and SP3 of different lengths may be alternately arranged with each other in the column direction. Also, the first and second sub-pixels SP1 and SP2 of different lengths may be alternately arranged with each other in the row direction.

The first and fourth sub-pixels SP1 and SP4 may each have a regular square with horizontal and vertical sides being equal in length. However, the first and fourth sub-pixels SP1 and SP4 are not limited to this.

Also, the second sub-pixel SP2 may include a horizontal side having the same length as that of the first sub-pixel SP1 and a vertical side having a shorter length than that of the first sub-pixel SP1. However, the second sub-pixel SP2 is not limited to this.

Moreover, the third sub-pixel SP3 may include a horizontal side having a shorter length than that of the first sub-pixel SP1 and a vertical side being the same length as that of the first sub-pixel SP1. However, the third sub-pixel SP3 is not limited to this.

Furthermore, the first and fourth sub-pixels SP1 and SP4 may be arranged in a diagonal line and the second and third sub-pixels SP2 and SP3 may be arranged in the other diagonal line. However, the arrangement of the first through fourth sub-pixels SP1-SP4 is not limited to this.

In such a structure arrangement, the first sub-pixel SP1 is formed to have a wider area than those of the other sub-pixels, i.e., the second through fourth sub-pixels SP2-SP4, and the second and third sub-pixels SP2 and SP3 are formed to each have major sides of different directions. Thus, the formation space of the fourth sub-pixel SP4 may be secured without any variation in the area of the pixel region. In other words, unlike those of the related art, an aperture ratio corresponding to the fourth sub-pixel SP4 may be secured by altering the shapes of the first through fourth sub-pixels SP1-SP4 and the arrangement thereof.

In addition, the positions of the first through fourth sub-pixels SP1-SP4 within the pixel region are fixed and distances between the first through fourth sub-pixels SP1-SP4 are uniformed. Thus, the OLED device of the exemplary embodiment can provide the same visibility as that of the stripe format of the related art.

Figure 3:
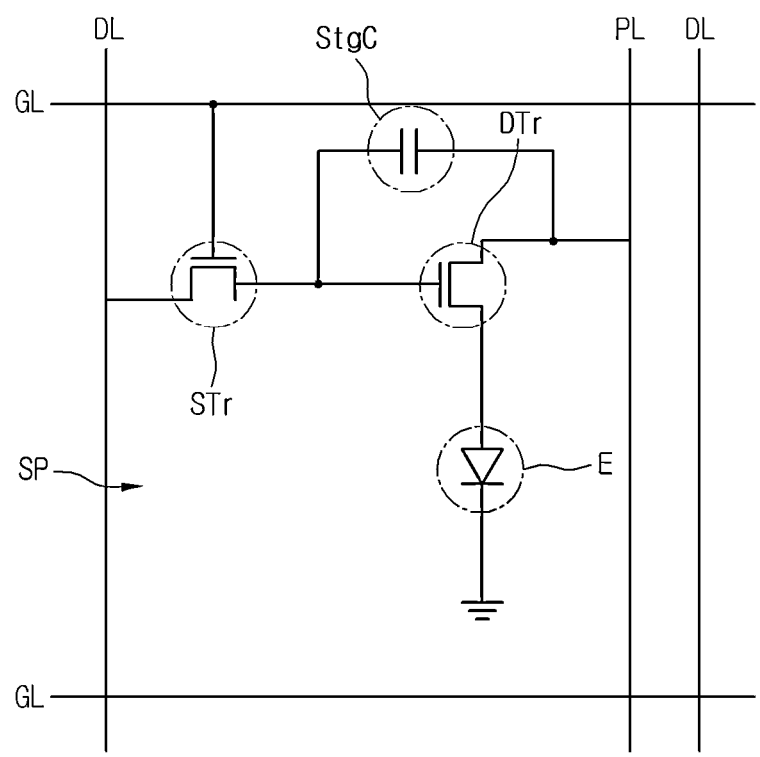
FIG. 3 is a circuit diagram schematically showing a configuration of a sub-pixel in FIG. 2.

FIG. 3 is a circuit diagram schematically showing the configuration of the sub-pixel shown in FIG. 2. Referring to FIG. 3, a single sub-pixel SP may include a switching thin film transistor STr, a driving thin film transistor DTr, a storage capacitor StgC, and an organic light emission diode E.

The sub-pixel SP may be defined by a gate line GL and a data line DL crossing each other such that the gate line GL and the data line DL are disposed in edges of the sub-pixel SP. Also, a power line PL may be formed in such a manner as to run parallel to the data line DL and cross the region of the sub-pixel SP.

The switching thin film transistor STr is connected to the gate line GL and the data line DL. Also, the switching thin film transistor STr is connected to the driving thin film transistor DTr and the storage capacitor StgC. The driving thin film transistor DTr is connected to the power line PL and the organic light emission diode E. Thus, a first electrode of the organic light emission diode E may be connected to the driving thin film transistor DTr, and a second electrode of the organic light emission diode E may be grounded.

According to the above-mentioned configuration, the switching thin film transistor STr within the sub-pixel SP is turned-on by a gate signal applied through the gate line GL and transfers a data signal on the data line DL to the driving thin film transistor DTr. Then, the driving thin film transistor DTr controls the level of a current signal flowing through the organic light emission diode E on the basis of the data signal transferred from the data line DL. Thus, the organic light emission diode E within the sub-pixel can realize a variety of gray scale levels.

Meanwhile, the storage capacitor StgC maintains constantly a gate voltage of the driving thin film transistor DTr while the switching thin film transistor STr is turned-off. Thus, the level of the current signal flowing through the organic light emission diode E can be constantly maintained.

Figure 4:
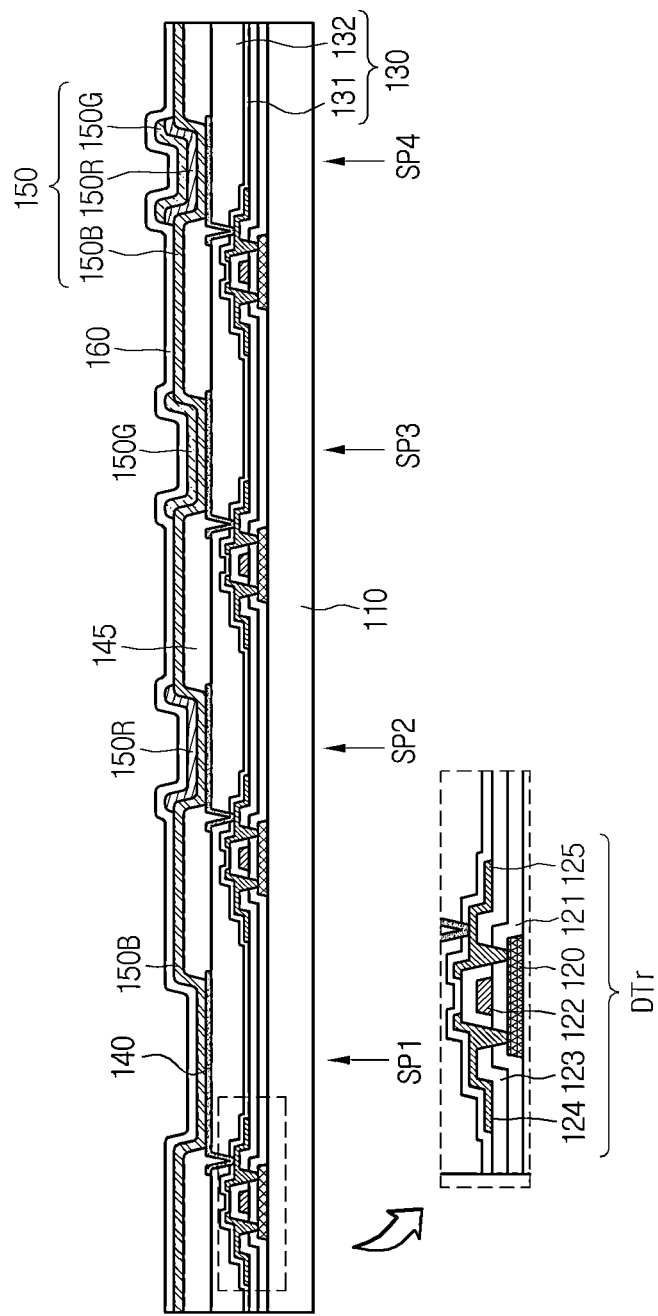
FIG. 4 is a cross-sectional view schematically showing a sectional surface of the sub-pixel in FIG. 2.

FIG. 4 is a cross-sectional view schematically showing a sectional surface of a sub-pixel in FIG. 2. In FIG. 4, the switching thin film transistor and the storage capacitor are omitted. However, the switching thin film transistor may have the same structure as the driving thin film transistor. Referring to FIG. 4, the OLED device may include a pixel having first through fourth sub-pixels SP1-SP4. The first through fourth sub-pixels SP1-SP4 may become blue, red, green and white sub-pixels B, R, G and W, but they are not limited to this.

Each sub-pixel may include a driving thin film transistor DTr disposed on a substrate 110, an insulation member 130 disposed on the substrate 110 provided with the driving thin film transistor DTr, and an organic light emission diode E disposed on the insulation member 130.

Specifically, the substrate 110 may become a flat glass substrate and a flat plastic substrate, but the substrate according to the exemplary embodiment of the present invention is not limited to these materials. Alternatively, the substrate 110 may become a flexible film with the property of being easily bent without breaking. The substrate 110 may be defined into a plurality of sub-pixel regions. For example, the substrate 110 may be defined into first through fourth sub-pixel regions. Thus, the first through fourth sub-pixels SP1-SP4 may be disposed in the first through fourth sub-pixel regions, respectively.

The driving thin film transistor DTr may be formed on each sub-pixel region. For example, the driving thin film transistor DTr may include a semiconductor pattern 120 disposed on the substrate 110, a gate insulation film 121 covering the semiconductor pattern 120, a gate electrode 122 disposed on the gate insulation film 121 opposite to a part of the semiconductor pattern 120, an interlayer insulation film 123 disposed on the gate insulation film 121 provided with the gate electrode 122, and source and drain electrodes 124 and 125 disposed on the interlayer insulation film 123 and electrically connected to source and drain regions of the semiconductor pattern 120. It is shown and explained that the driving thin film transistor DTr has a top-gate structure. However, the embodiment of the present invention is not limited to this.

The insulation member 130 may be disposed on the substrate 110 provided with the driving thin film transistor DTr. The insulation member 130 may include an inorganic insulation film 131 or a double-layered film of an inorganic insulation film 131 and an organic insulation film 132. However, the insulation member 130 is not limited to the above-mentioned materials and structures. Alternatively, the insulation member 130 may be formed in a single layer structure with an inorganic insulation film or an organic insulation film.

The organic light emission diode E may be disposed in each sub-pixel region and electrically connected to the driving thin film transistor DTr. Such an organic light emission diode E may include a first electrode 140, a functional layer 150 and a second electrode 160 that are sequentially stacked on the insulation member 130.

The first electrode 140 may be patterned into each sub-pixel unit (or size). Thus, the first electrodes 140 of the sub-pixels may be arranged with being spaced a fixed distance from one another. Also, the first electrode 140 may be electrically connected to the drain electrode 125 through a contact hole that is formed in the insulation member 130.

A bank 145 is disposed on the entire surface of the substrate 110 with the first electrodes 140. The bank 145 has an opening for exposing a part of the first electrode 140. The bank 145 disposed on the substrate 110 may cover edges of the first electrode 140. Also, a functional layer and a second electrode 160, which will be described later, are sequentially stacked on the first electrode 140 corresponding to the opening of the bank 145. Thus, a light emitting region (LR in FIG. 1) for substantially emitting light is defined by the bank 145. In accordance therewith, definition and an aperture ratio of the sub-pixel SP can depend on the light emitting region (LR in FIG. 2).

The bank 145 may be used to secure a process margin for forming the functional layer 150. The function layer 150 may be selectively formed in desired regions through a deposition process using a mask. However, the functional layer 150 may be formed in a non-desired region due to a variety of factors such as an error in a mask fabrication process or a misalignment of the mask in the deposition process. Although the functional layer is formed at a region different from a designed position, the process margin of the functional layer 150 secured by the bank 145 can prevent fault generation. Also, the bank 145 may be used to prevent the generation of a short circuit between the first and second electrodes 140 and 160.

The functional layer 150 interposed between the first electrode 140 and the second electrode 160, which will be described later, may be formed from a material that emits light by replying to a current signal flowing through the organic light emission diode E. Also, the functional layer 150 disposed in each sub-pixel region may be used to set the color of each sub-pixel. For example, the functional layer 150 may include first through third functional layers 150B, 150R and 150G that are capable of displaying different colors from one another.

The first functional layer 150B may be formed on the entire area including a plurality of sub-pixel regions, for example on upper surfaces of the bank 145 and the first electrode 140 of each sub-pixel. In other words, the first functional layer 150B may be included in the first through fourth sub-pixels SP1-SP4. Such a first functional layer 150B may be formed from a material emitting blue light. As an example of the material forming the first functional layer 150B, any one of spiro-DPVBi, spiro-6P, distyrylbenzene (DSB), and distyrylarylene (DSA) may be used. Alternatively, the material forming the first functional layer 150B may include host material and dopant materials. As a host material, one of CBP (4,4'-N,N-dicarbazole-biphenyl), ADN (Alq3,9,10-dinaphthyl anthracene), TCTA (4,4',4"-tris(N-carbazolyl)-triphenylamine), dmCBP, Liq, TPBI, Balq (Bis(2-methyl-8-quinlinolato-N1,O8)-(1,1'-Biphenyl-4-olato)aluminium), and BCP may be used. One of F2Irpic, (F2ppy)2Ir(tmd), Ir(dfppz)3, ter-fluorene, BPAVBi (4,4'-Bis(4-(di-p-tolylamino)styryl)biphenyl), and TBP (2,5,8,11-tetra-t-butyl perylene) may be used as a dopant material.

The second functional layer 150R may be formed along the second and fourth sub-pixels SP2 and SP4 in a stripe shape. Such a second functional layer 150R may be formed from a material emitting red light. The material forming the second functional layer 150R may include a mixture of one host material of CBP and Balq and one red dopant material of Ir(Mnpy)3, Btp2Ir(acac)(bis(2O-benzo[4,5-a]thienyl)pyridinato-N,C3O)iridium(zcetylactonate), and Btp2Ir(acac) and (iridium(III)bis(1-phenylisoquinolyl)-N,C2')acetylacetonate.

Although the first and second functional layers 150B and 150R may overlap with each other in the second sub-pixel SP2, a mixed phenomenon between a color light of the first functional layer 150B and the other color light of the second functional layer 150R within the second sub-pixel SP2 may be prevented through the material selection and the thickness adjustment for the first and second functional layers 150B and 150R. Specifically, the second functional layer 150R can block blue light generated in the first functional layer 150B from passing through the second functional layer 150R, so that the second sub-pixel SP2 can emit only red light. Alternatively, an absorptive layer (not shown) adapted to absorb blue light from the first functional layer 150B, may be interposed between the first and second functional layers 150B and 150R, but the embodiment of the present invention is not limited to this. Moreover, the second functional layer 150R may become a color conversion layer for converting blue light emitted from the first functional layer 150B into red light. The color conversion layer may include a fluorescent material converting blue light into light with a fixed wavelength, but it is not limited to this.

The third functional layer 150G may be formed along the regions of the third and fourth sub-pixels SP3 and SP4 in a stripe shape. Such a third functional layer 150G may be formed from a material emitting green light. The material forming the third functional layer 150G may include a mixture of one host material of CBP and Balq and one green dopant material of Ir(Mnpy)3, Btp2Ir(acac)(bis(2O-benzo[4,5-a]thienyl)pyridinato-N,C3O)iridium(zcetylactonate), and Btp2Ir(acac)(iridium(III)bis(1-phenylisoquinolyl)-N,C2') acetylacetonate.

Although the first and third functional layers 150B and 150G overlap with each other in the third sub-pixel SP3, a mixed phenomenon between a color light of the third functional layer 150G and the other color light of the third functional layer 150G within the third sub-pixel SP3 may be prevented through the material selection and the thickness adjustment for the first and second functional layers 150B and 150R. In other words, the first functional layer 150G can block blue light generated in the first functional layer 150B from passing through the third functional layer 150G so that the third sub-pixel SP3 can emit only green light. Alternatively, an absorptive layer (not shown) adapted to absorb blue light from the first functional layer 150B, may be interposed between the first and third functional layers 150B and 150G, but the embodiment of the present invention is not limited to this. Moreover, the third functional layer 150G may become a color conversion layer for converting blue light emitted from the first functional layer 150B into green light. The color conversion layer may include a fluorescent material converting blue light into light with a fixed wavelength.

The first through third functional layers 150B, 150R and 150G may overlap with one another in the region of the fourth sub-pixel SP4. In other words, the fourth sub-pixel SP4 includes the first through third functional layers 150B, 150R and 150G overlapping with one another. Thus, the fourth sub-pixel SP4 can emit white light.

The second and third functional layers 150R and 150G with different widths are disposed in crossing relation to each other. Thus, the second functional layer 150R on the second sub-pixel region SP2 and the third functional layer 150G on the third sub-pixel SP3 may have rectangular shapes with major sides (or edges) progressing in different directions from each other, respectively. In such a structure arrangement, the first functional layer 150B is formed in a common layer structure, whereas the second and third functional layers 150R and 150G are formed using a stripe mask. In accordance therewith, the OLED device according to the exemplary embodiment of the present invention can greatly enhance process property and productivity compared to that of the related art.

Also, the second and third functional layers 150R and 150G with different widths are formed in directions crossing each other using a stripe mask. Thus, the aperture width of the stripe mask used for forming the second and third functional layers 150R and 150G may be enlarged. In accordance therewith, the process productivity and mask productivity can increase, and visibility (visual recognizability) and an aperture ratio can be simultaneously secured. Moreover, the second and third functional layers 150R and 150G are formed in stripe shapes in crossing relation to each other. Thus, a process margin caused by the stripe mask itself may be reduced. Furthermore, the first functional layer 150B may be formed in larger width and length than those of the second and third functional layers 150R and 150G. Thus, the first functional layer 150B can have a larger area than those of the other sub-pixels, i.e., the second and third sub-pixels 150R and 150G.

Although it is not shown in the drawings, at least one of a hole injection layer and a hole transport layer may be interposed between the first electrode 140 and the functional layer 150 in order to enhance a light emission efficiency of the organic light emission diode E. In addition, at least one of an electron injection layer and an electron transport layer may be interposed between the functional layer 150 and the second electrode 160.

The hole injection layer, the hole transport layer, the electron injection layer and the electron transport layer may be disposed throughout the display area of the OLED device. Similarly to the functional layer 150, each of the hole injection layer, the hole transport layer, the electron injection layer and the electron transport layer may be patterned into pixel regions.

The second electrode 160 may be disposed on the entire surface of the substrate 110 with the first through third functional layers 150B, 150R and 150G. The first and second electrodes 140 and 160 may be formed from any one of a transparent conductive material and a reflection conductive material according to the emission mode of the OLED device. In a bottom emission mode OLED device emitting light toward the substrate 110, the first electrode 140 may be formed from the transparent conductive material, whereas the second electrode 160 may be formed from the reflection conductive material. On the other hand, in a top emission mode OLED device emitting light toward the second electrode 160, the first electrode 140 may be formed the reflection conductive material, whereas the second electrode 160 may be formed from the transparent conductive material. As an example of the transparent conductive material, one of indium-tin-oxide (ITO) and indium-zinc-oxide (IZO) may be used. The reflection conductive material may become a metal, such as silver Ag or aluminum Al, with a reflective property.

Furthermore, the OLED device may include a sealing member combined with the substrate 110 that includes the organic light emission diode E, even though it is not shown in the drawings. The sealing member can isolate the organic light emission diodes E from the external environment, and protects the organic light emission diodes E from the external moisture and oxygen. Such a sealing member may become a sealing substrate combined with the substrate 110 or an inorganic passivation film coated on the substrate 110 including the organic light emission diodes E. However, the sealing member is not limited to the above-mentioned shapes.

Figure 5:
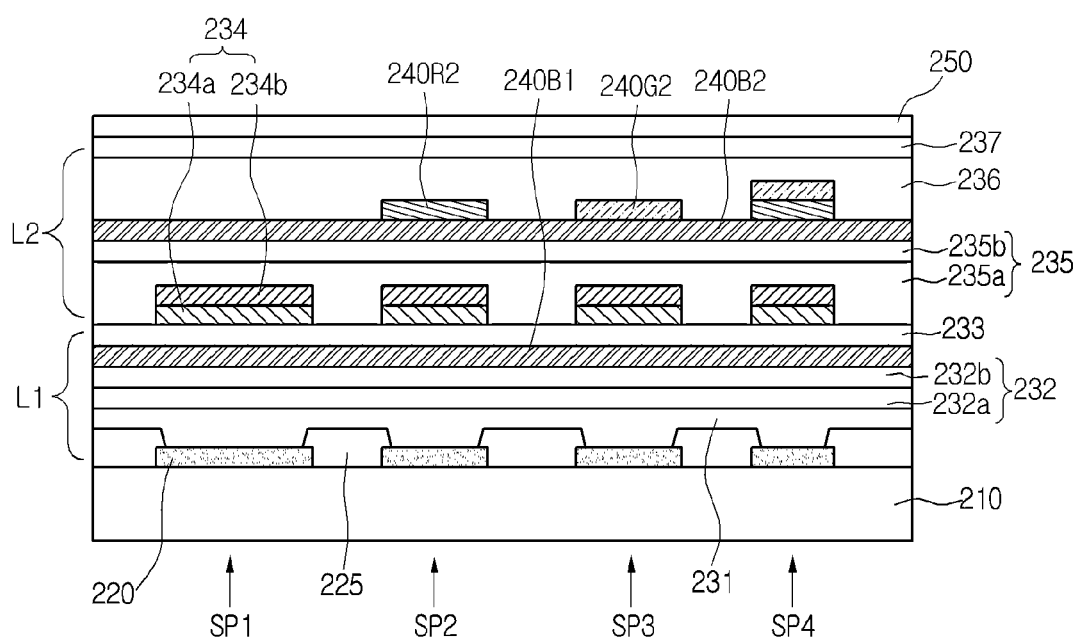
FIG. 5 is a cross-sectional view schematically showing an OLED device according to a second exemplary embodiment of the present invention.

FIG. 5 is a cross-sectional view schematically showing an OLED device according to a second exemplary embodiment of the present invention. The OLED device of the second exemplary embodiment has the same configuration as that of the first embodiment except for the stack structure of an organic light emission diode. Accordingly, the description of the first embodiment to be repeated in the second embodiment of the present invention will be omitted. Also, the structure of the thin film transistor is omitted in FIG. 5.

Referring to FIG. 5, the OLED device may include a pixel having first through fourth sub-pixels SP1-SP4 that are arranged in a quad type on a substrate 210. The first through fourth sub-pixels SP1-SP4 may become blue, red, green and white sub-pixels B, R, G and W. Each sub-pixel may include a driving thin film transistor DTr disposed on a substrate 210, an insulation member 130 (not shown) disposed on the substrate 210 provided with the driving thin film transistor DTr, and an organic light emission diode E disposed on the insulation member 130. The organic light emission diode E may include a first light emission unit L1, an electrical charge generation layer 234 and a second light emission unit L2 that are interposed between first and second electrodes 220 and 250.

The first light emission unit L1 may include first through third sub-functional layers 240B1, 240R2 and 240G2. The first sub-functional layer 240B1 may be commonly formed on a plurality of sub-pixels. Such a first sub-functional layer 240B1 can emit blue light by replying to a current signal flowing through the organic light emission diode E. Similarly, the second and third sub-functional layers 240R2 and 240G2 can emit red light and green light, respectively.

The first light emission unit L1 can further include at least one of a sub hole injection layer 231 and a sub hole transport layer 232 that are interposed between the first electrode 220 and the first sub-functional layer 240B1. The sub hole injection and transport layers 231 and 232 may be used to effectively apply between the first electrode 220 and the first sub-functional layer 240B1.

The sub hole injection layer 231 may include a material based on one of perylene, pyrene, tetracene and antracene. The sub hole transport layer 232 may include first and second sub hole transport layers 232a and 232b that are sequentially stacked on the sub hole injection layer 231. The first sub hole transport layer 231 may be formed from a mixture of a hole-transportable material and a formation material of the sub hole injection layer 231. As an example of the hole-transportable material, one of a NPD-based material including triphenyl amine, a TPD-based material corresponding to a diamine derivative, and poly(9-vinylcarbazole) corresponding to a photoconductive polymer may be used. Meanwhile, the second sub hole transport layer 232b may be formed from a hole-transportable material. The sub hole transport layer 232 having a stacked layer structure of the first and second sub hole transport layers 232a and 232b can extend the lifespan of the OLED device.

The first light emission unit L1 can further include a sub electron transport layer 233 interposed between the first sub-functional layer 240B1 and the second light emission unit L2. The sub electron transport layer 233 may be formed from at least one material selected from a material group which includes Alq3(tris(8-hydroxyquinolino)aluminum), PBD(2-(Biphenyl-4-yl)-5-(4-tert-butylphenyl)-1,3,4-oxadiazole), TAZ(3-phenyl-4-(1'-naphthyl)-5-phenyl-1,2,4-triazole), spiro-PBD and BAlq(bis-(2-methyl-8-quinolinolato)-4-(phenyl-phenolato) aluminum-(III)).

The second light emission unit L2 may include first through third functional layers 240B2, 240R2 and 240G2 that are adapted to realize different colors from one another. The first functional layer 240B2 may include the same material as the first sub-functional layer 240B1. Thus, the first functional layer 240B2 can emit blue light. Similarly, the second and third functional layers 240R2 and 240G2 can emit red light and green light, respectively.

The first functional layer 240B2 may be commonly formed on the plurality of sub-pixels. The second functional layer 240R2 may be formed along the second and fourth sub-pixels SP2 and SP4 in a stripe shape. Similarly, the third functional layer 240G2 may be formed along the third and fourth sub-pixels SP3 and SP4 in a stripe shape. Also, the second and third functional layers 240R2 and 240G2 can cross each other and overlap with each other, on the fourth sub-pixel SP4. Thus, the first through third functional layers 240B2, 240R2 and 240G2 may be formed on the fourth sub-pixel SP4. Such first through fourth sub-pixels SP1-SP4 can emit blue, red, green and white lights. Therefore, the OLED device according to the second embodiment of the present invention can realize full color.

The electrical charge generation layer 234 may be interposed between the first and second light emission layers L1 and L2. The electrical charge generation layer 234 can internally generate holes and electrons and apply the holes and the electrons to the first and second light emission units L1 and L2, when an electrical field is generated between the first and second electrodes 220 and 250. In order to provide the holes and the electrons, the electrical charge generation layer 234 may include an N-type electrical-charge generation layer 234a and a P-type electrical-charge generation layer 234b. The N-type electrical-charge generation layer 234a is disposed on the first light emission unit L1. The N-type electrical-charge generation layer 234a may be used to apply electrons to the first light emission unit L1. The N-type electrical-charge generation layer 234a may include a first host material and a first dopant material. The first dopant material may be previously doped into the first host material.

The first dopant material may become one of an alkali metal and alkali earth metal. As an example of the alkali metal, one of lithium Li, cesium Cs, sodium Na, potassium K and the like may be used. The alkali earth metal may include strontium Sr, barium Ba, radium Ra, magnesium Mg and so on. The first host material may become an electron transportable material, such as Alq3(tris(8-hydroxyquinolino)aluminum), Bphen(4,7-diphenyl-1,10-phenanthroline) or others.

The P-type electrical-charge generation layer 234b is interposed between the N-type electrical-charge generation layer 234a and the second light emission unit L2. The P-type electrical-charge generation layer 234b may be used to apply holes to the second light emission unit L2. The P-type electrical-charge generation layer 234b may include a second host material and a second dopant material. The second dopant material may be previously doped into the second host material. The second dopant material may include at least one selected from a material group that includes a metal oxide, F4-TCNQ (tetrafluoro-tetracyanoquinodimethane), HAT (hexanitrile-hexaazatriphenylene), $FeCl_3$, $FeF_3$ and $SbCl_5$. The metal oxide material may become one of $MoO_3$, $V_2O_5$, ITO, $TiO_2$, $WO_3$, $SnO_2$ and the like. The second host material may become a hole transportable material having at least one material selected from a material group that includes NPD(N, N-dinaphthyl-N,N'-diphenyl benzidine), TPD(N,N'-bis-(3-methylphenyl)-N,N'-bis-(phenyl)-benzidine), MTDATA(4, 4',4''-Tris(N-3-methylphenyl-N-phenyl-amino)-triphenylamine) and others. Such an electrical charge generation layer 234 may be patterned into each sub-pixel unit.

The second light emission unit L2 can further include a hole transport layer 235 interposed between the electrical charge generation layer 234 and the first functional layer 240B2. The hole transport layer 235 may include a stacked layer structure of first and second hole transport layers 235a and 235b. The hole transport layer 235 may be formed from the same material as the sub hole transport layer 232. The second light emission unit L2 may further include an electron transport layer 236 and an electron injection layer 237 that are sequentially stacked in such a manner as to cover the first through third functional layers 240B2, 240R2 and 240G2. The electron transport layer 236 may be formed from the same material as the sub electron transport layer 233. Meanwhile, the electron injection layer 237 may be formed from one of Lif, MgO, MgF2, LiO2, CaF2 and the like.

Thus, the first functional layer for emitting blue light is additionally stacked. Thus, the OLED device according to the second exemplary embodiment of the present invention can enhance weaker brightness of blue light compared to those of the other color lights.

Figure 6:
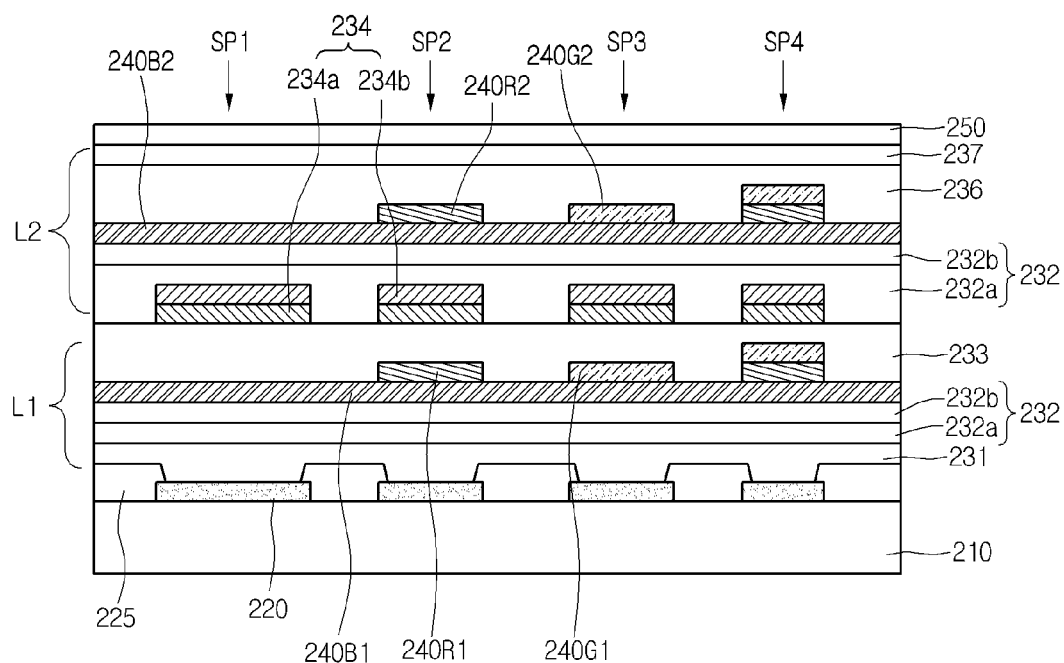
FIG. 6 is a cross-sectional view schematically showing an OLED device according to a third exemplary embodiment of the present invention.

FIG. 6 is a cross-sectional view schematically showing an OLED device according to a third exemplary embodiment of the present invention. The OLED device of the third exemplary embodiment has the same configuration as that of the second embodiment described above except for the structure of a first light emission unit. Thus, the description of the first embodiment to be repeated in the second embodiment of the present invention will be omitted. Also, the structure of the thin film transistor is omitted in FIG. 6.

Referring to FIG. 6, the OLED device may include a pixel having first through fourth sub-pixels SP1-SP4 that are arranged in a quad type on a substrate 210. The first through fourth sub-pixels SP1-SP4 may become blue, red, green and white sub-pixels B, R, G and W. Each sub-pixel may include a driving thin film transistor DTr disposed on the substrate 210, an insulation member 130 (not shown) disposed on the substrate 210 provided with the driving thin film transistor DTr, and an organic light emission diode E disposed on the insulation member 130. The organic light emission diode E may include a first light emission unit L1, an electrical charge generation layer 234 and a second light emission unit L2 that are interposed between first and second electrodes 220 and 250. The first and second light emission units L1 and L2 may be formed in the same structure.

The first light emission unit L1 may include first through third sub-functional layers 240B1, 240R1 and 240G1. The first sub-functional layer 240B1 may be commonly formed on a plurality of sub-pixels. The second sub-functional layer 240R1 may be formed along the second and fourth sub-pixels SP2 and SP4 in a stripe shape. Similarly, the third sub-functional layer 240G1 may be formed along the third and fourth sub-pixels SP3 and SP4 in a stripe shape. Also, the second and third sub-functional layers 240R1 and 240G1 may cross each other and overlap with each other, on the fourth sub-pixel SP4. Thus, the first through fourth sub-pixels SP1-SP4 can emit blue, red, green and white lights, respectively.

The second light emission unit L2 may include first through third functional layers 240B2, 240R2 and 240G2. The first through third functional layers 240B2, 240R2 and 240G2 may be formed in the same shape as the respective first through third sub-functional layers 240B1, 240R1 and 240G1.

In the OLED device according to the third exemplary embodiment of the present invention, the first and second light emission units with the same structure are stacked. All the brightnesses of red, green, blue and white lights can increase.

FIGS. 7A through 7D are planar views illustrating a method of fabricating an OLED device according to a fourth exemplary embodiment of the present invention. FIGS. 8A through 8E are cross-sectional views also illustrating the method of fabricating an OLED device according to the fourth embodiment of the present invention.

Figure 7A:
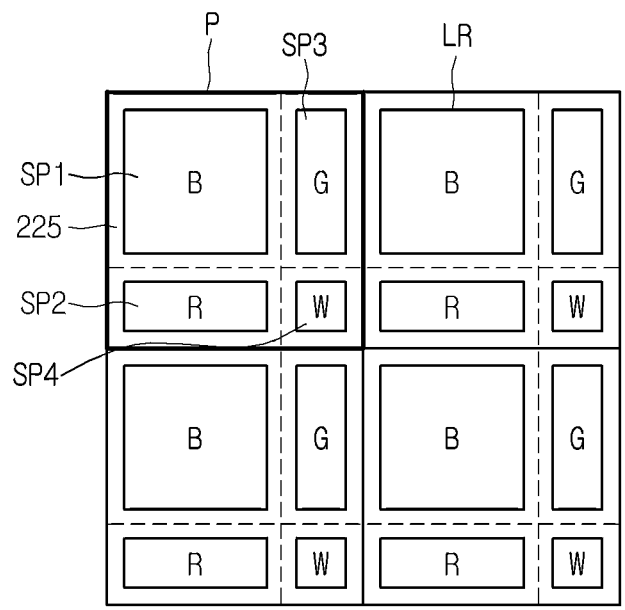
FIGS. 7A through 7D are cross-sectional views illustrating a method of fabricating an OLED device according to a fourth exemplary embodiment of the present invention.

Referring to FIGS. 7A and 8A, a substrate 110 is first prepared in order to fabricate an OLED device. The substrate 110 may include first through fourth sub-pixel regions SP1-SP4 that are arranged in a quad type.

A semiconductor pattern 120 is formed on each of the sub-pixel regions. The semiconductor pattern 120 may be prepared by forming an amorphous silicon layer on the substrate 110 through a deposition process, crystallizing the amorphous silicon layer, and patterning the crystallized silicon layer. A gate insulation film 121 is formed on the substrate 110 with the semiconductor pattern 120. The gate insulation film 121 may be formed, through a chemical vapor deposition (CVD) process, from any one of silicon nitride and silicon oxide. A gate electrode 122 is formed on the gate insulation film 121 opposite to a channel region of the semiconductor pattern 120. During the formation of the gate electrode 122, a gate line (not shown) connected to the gate electrode 122 can also be formed. An interlayer insulation film 123 is formed on the gate insulation film 121 provided with the gate electrode 122. The interlayer insulation film 123 may be formed, through the chemical vapor deposition (CVD) process, from any one of silicon nitride and silicon oxide. Thereafter, via holes each penetrating through the interlayer insulation film 123 and the gate insulation film 121 are formed. The via holes may partially expose both ends of the semiconductor pattern 120, and more specifically, may expose source and drain region of the semiconductor pattern 120. Subsequently, source and drain electrodes 124 and 125 are formed on the interlayer insulation film 123. The source and drain electrodes 124 and 125 are connected to the source and drain regions of the semiconductor pattern 120 through the via holes. In this way, a driving thin film transistor DTr, which includes the semiconductor pattern 120, the gate insulation film 121, the gate electrode 122, and the source and drain electrodes 124 and 125, may be formed in each of the sub-pixel regions on the substrate 110. Although they are not shown in the drawings, a switching thin film transistor and a storage capacitor may be simultaneously formed when the driving thin film transistor DTr is formed.

After the driving thin film transistor DTr is formed, an insulation member 130 is formed on the interlayer insulation film 123 including the driving thin film transistor DTr. The insulation member 130 may include any one of an inorganic insulation film 131, an organic insulation film 132 and a stacked layer thereof. The inorganic insulation film 131 may be formed, through a chemical vapor deposition (CVD) process, from one of silicon nitride and silicon oxide. The organic insulation film 132 may be formed through a wet process. As an example of the wet process, one of a spin coating method, a dip coating method, an ink jet printing method, a screen printing method, a die coating method, a doctor blade method and so on may be used. The organic insulation film 132 may be formed from one of a photoacrylic resin, a benzocyclobutene resin, a polyimide resin and so on.

When the insulation member 130 is formed, a contact hole exposing the drain electrode 125 of the driving thin film transistor DTr is formed in the insulation member 130. After that, a first electrode 140 electrically connected to the drain electrode 125 through the contact hole is formed on the insulation member 130. The first electrode 140 may be prepared by forming a conductive material film on the insulation member 130 and patterning the conductive material film into each sub-pixel region.

A bank 145 with an opening corresponding to an emission region of the first electrode 140 is formed on the insulation member 130 provided with the first electrode 140. The bank 145 may be prepared by a photosensitive resin film on the entire surface of the substrate 110 provided with the first electrode 140, and performing exposure and development process for the photosensitive resin film.

Figure 7B:
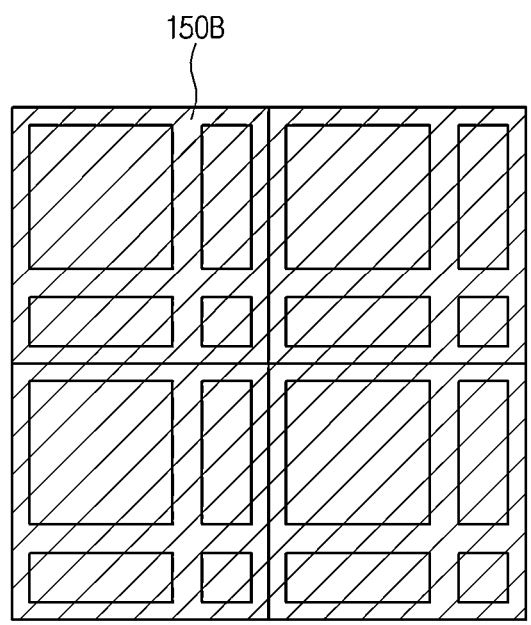
Figure 8B:
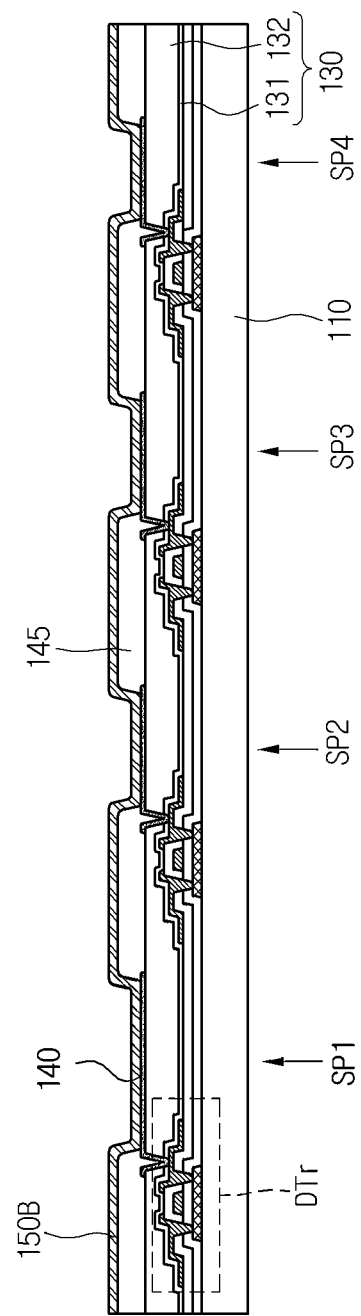

As shown in FIGS. 7B and 8B, a first functional layer 150B is formed on all the plurality of sub-pixel regions including the first electrode 140. The first functional layer 150B may be formed from a material that is able to emit blue light. The first functional layer 150B may be substantially formed through a deposition process that uses an open mask simultaneously exposing the plurality of sub-pixels. In other words, the first functional layer 150B may be formed on the whole of the display area for displaying an image.

As an example of the material for forming the first functional layer 150B, any one of spiro-DPVBi, spiro-6P, distyrylbenzene (DSB), and distyrylarylene (DSA) may be used. Alternatively, the material for forming the first functional layer 150B may include host material and dopant materials. As a host material, one of CBP (4,4'-N,N-dicarbazole-biphenyl), ADN (Alq3,9,10-dinaphthyl anthracene), TCTA (4,4',4"-tris(N-carbazolyl)-triphenylamine), dmCBP, Liq, TPBI, Balq (Bis(2-methyl-8-quinlinolato-N1,08)-(1,1'-Biphenyl-4-olato)aluminium), and BCP may be used. One of F2Irpic, (F2ppy)2Ir(tmd), Ir(dfppz)3, ter-fluorene, BPAVBi (4,4'-Bis(4-(di-p-tolylamino)styryl)biphenyl), and TBP (2,5, 8,11-tetra-t-butyl perylene) may be used as a dopant material.

Figure 7C:
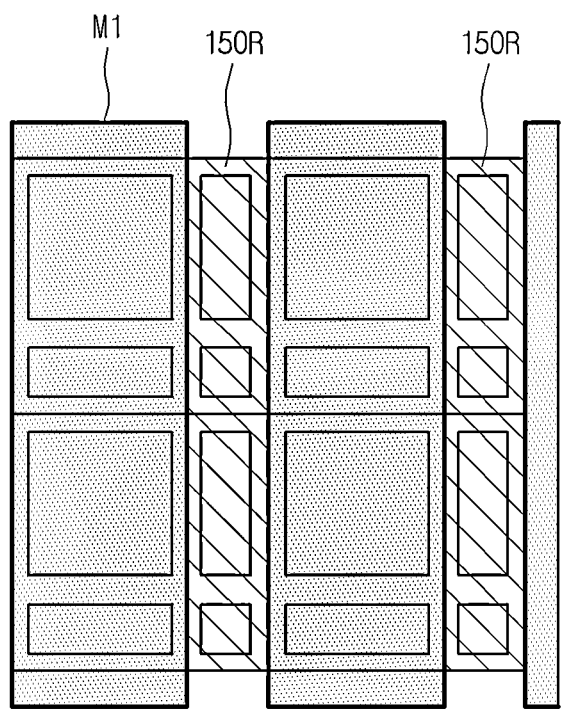
Figure 8C:
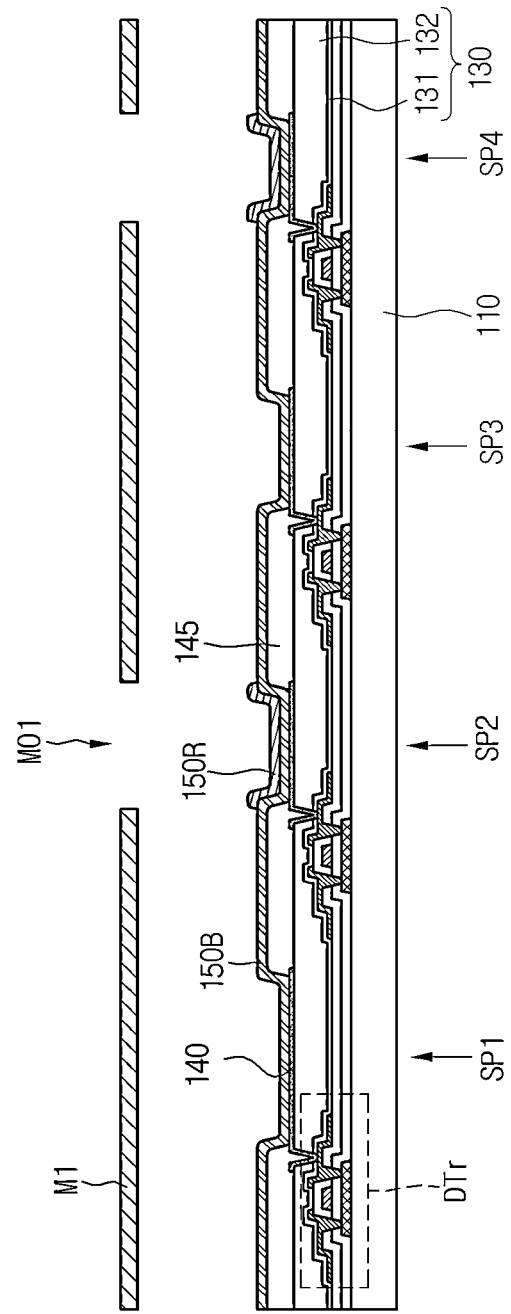

Referring to FIGS. 7C and 8C, a second functional layer 150R may be formed along the second and fourth sub-pixels SP2 and SP4. Such a second functional layer 150R may be formed from a material that emits red light. As an example of the material for forming the second functional layer 150R, a mixture of one host material of CBP and Balq and one red dopant material of Ir(Mnpy)3, Btp2Ir(acac)(bis(2O-benzo[4, 5-a]thienyl)pyridinato-N,C3O)iridium(zcetylactonate), and Btp2Ir(acac) and (iridium(III)bis(1-phenylisoquinolyl)-N, C2')acetylacetonate may be used. Alternatively, the second functional layer 150R may become a color conversion layer for converting blue light emitted from the first functional layer 150B into red light. Such a second functional layer 150R may be formed through a deposition process that uses a first mask M1 with an opening MO1 of a first stripe shape. The first stripe opening MO1 may expose the second and fourth sub-pixels SP2 and SP4 that are arranged alternately and repeatedly with each other.

Figure 7D:
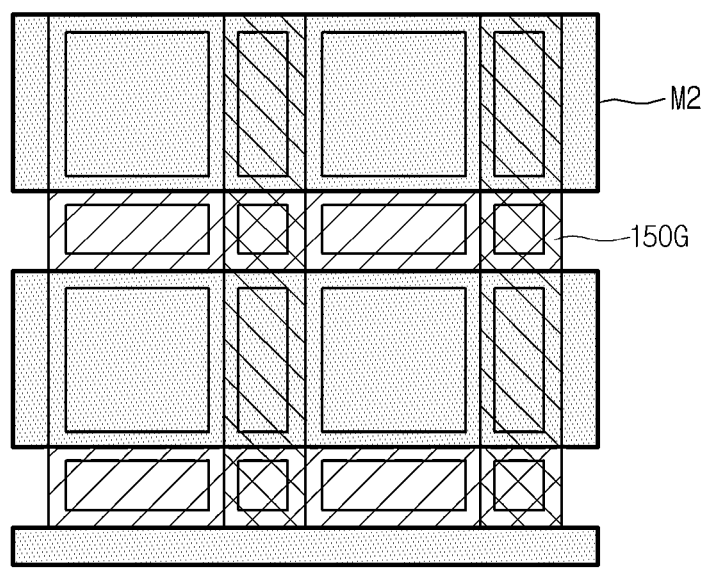
Figure 8D:
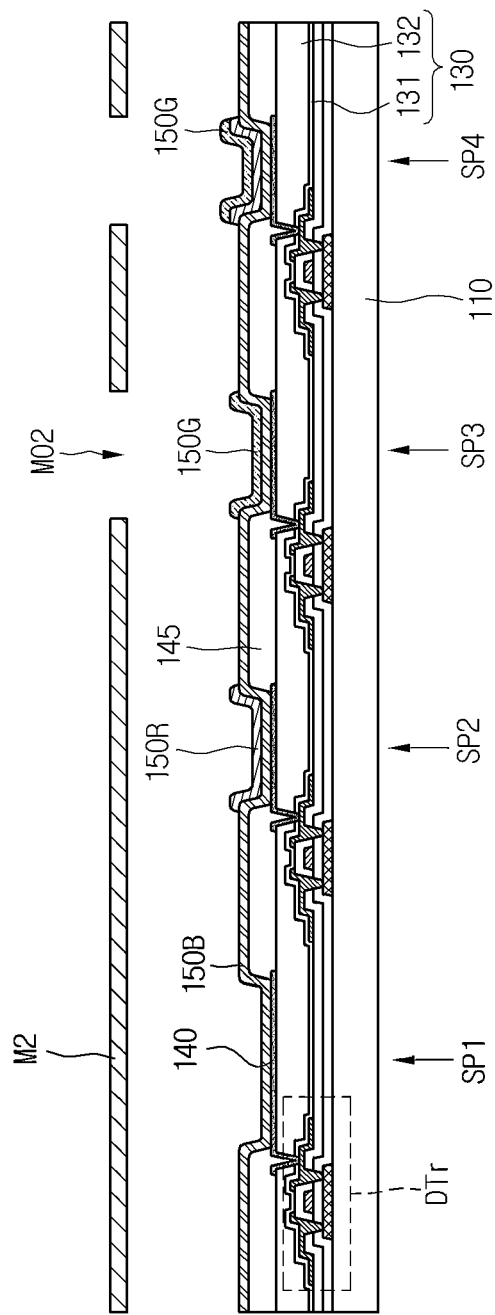

As shown in FIGS. 7D and 8D, a third functional layer 150G may be formed along the regions of the third and fourth sub-pixels SP3 and SP4. Such a third functional layer 150G may be formed from a material that emits green light. The material for forming the third functional layer 150G may include a mixture of one host material of CBP and Balq and one green dopant material of Ir(Mnpy)3, Btp2Ir(acac)(bis (2O-benzo[4,5-a]thienyl)pyridinato-N,C3 O)iridium(zcetylactonate), and Btp2Ir(acac)(iridium(III)bis(1-phenylisoquinolyl)-N,C2')acetylacetonate. Alternatively, the third functional layer 150G may become a color conversion layer for converting blue light emitted from the first functional layer 150B into green light. The third functional layer 150G may be formed through a deposition process that uses a second mask M2 with an opening MO2 of a second stripe shape. The second stripe opening MO2 may be aligned in crossing relation to the first stripe opening MO1. The second stripe opening MO2 may expose the third and fourth sub-pixels SP3 and SP4 that are arranged alternately and repeatedly with each other.

The first through third functional layers 150B, 150R and 150G may be formed in such a manner as to overlap with one another on the fourth sub-pixel SP4. This results from the fact that the first and second stripe openings MO1 and MO2 overlap with each other on the fourth sub-pixel SP4.

Although it is not shown in the drawings, at least one of a hole injection layer and a hole transport layer may be further formed between the first electrode 140 and the functional layer 150 in order to enhance a light emission efficiency of the organic light emission diode E. In addition, at least one of an electron injection layer and an electron transport layer may be formed between the functional layer 150 and the second electrode 160. The hole injection layer, the hole transport layer, the electron injection layer and the electron transport layer may be formed throughout the display area of the OLED device using one of a wet process and a deposition process. Each of the hole injection layer, the hole transport layer, the electron injection layer and the electron transport layer may be formed in the same method as the organic light emission layer, and patterned into each sub-pixel region.

Figure 8E:
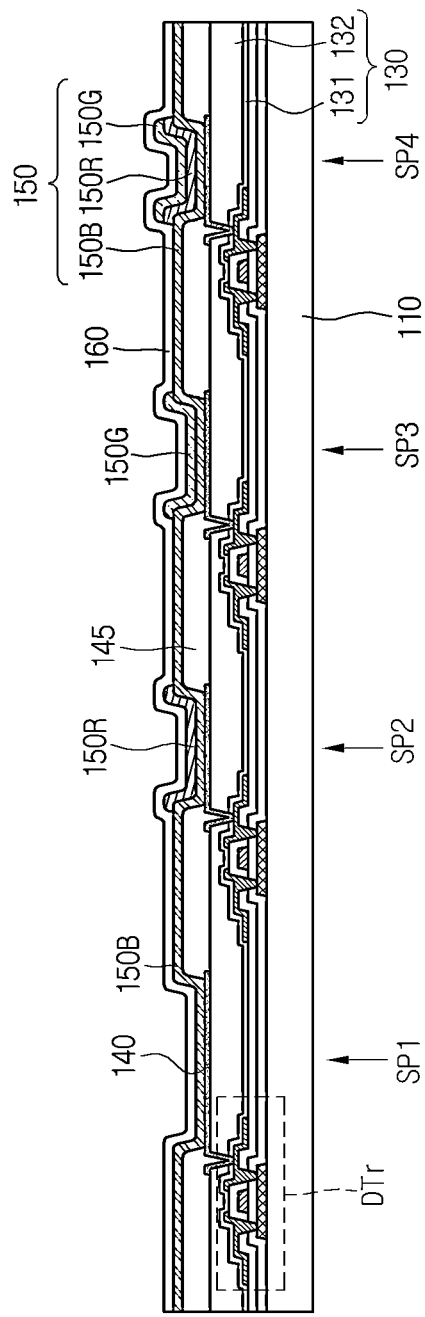

As shown in FIG. 8E, a second electrode 160 is formed on the entire surface of the substrate 110 provided with the first through third functional layers 150B, 150R and 150G. Although it is not shown in the drawings, a sealing process for sealing the organic light emission diode E on the substrate 110 may further be performed.

It is explained that the organic light emission diode includes a single light emission unit, but the fourth exemplary embodiment of the present invention is not limited to this. Alternatively, the organic light emission diode may further include at least one light emission unit. For example, a first sub-functional layer and an electrical charge generation layer may further be formed. The first sub-functional layer may be formed between the first electrode and the first functional layer so as to be shared by the plurality of sub-pixels. The electrical charge generation layer may be formed on the first sub-functional layer. According to another example, first through third sub-functional layers and an electrical charge generation layer may further be formed between the first electrode and the first functional layer. In this case, the first through third sub-functional layers may be formed in the same structure as the respective first through third functional layers.

Next, an OLED device fabrication procedure according to a comparable example and the present embodiment will be explained referring to FIGS. 9A and 9B.

Figure 9A:
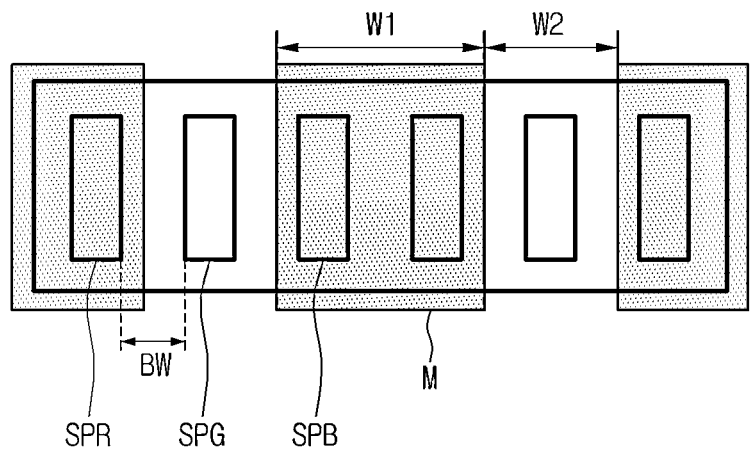
FIG. 9A is a planar view schematically illustrating a process of forming a functional layer according to a comparable example.

FIG. 9A is a planar view schematically illustrating a process of forming a functional layer according to a comparable example. Referring to FIG. 9A, the OLED device of the comparable example includes pixels with a stripe format. In the comparable example, each pixel includes red, green and blue sub-pixels SPR, SPG and SPB arranged in a row direction.

In the comparable example, the functional layer may be formed through a deposition process that uses a stripe mask M. It is difficult for the stripe mask M to reduce the distance between openings MO, i.e., the width W1 of a rib. In fact, each of the ribs within the stripe mask M must be formed in a width range of 5~50 μm. If the width of the rib becomes smaller than the width range, the stripe mask M cannot endure own tension during a deposition process. Also, the width W2 of the stripe opening MO becomes larger than 33 μm due to the limitations in the deposition process and the mask fabrication process.

In order to provide a process margin for covering process errors such as an alignment error in a mask deposition process and a mask fabrication error, it is necessary for the OLED device to form a bank. Specifically, if masks used for forming functional layers in the sub-pixels adjacent to each other are misaligned, the adjacent functional layers may be formed to overlap with each other. Thus, the bank must be formed in a width of above 24 μm so as to provide enough process margin to cover the alignment error between the masks. In other words, it is difficult to form the bank in a width of below 24 μm due to the process limitation.

Figure 9B:
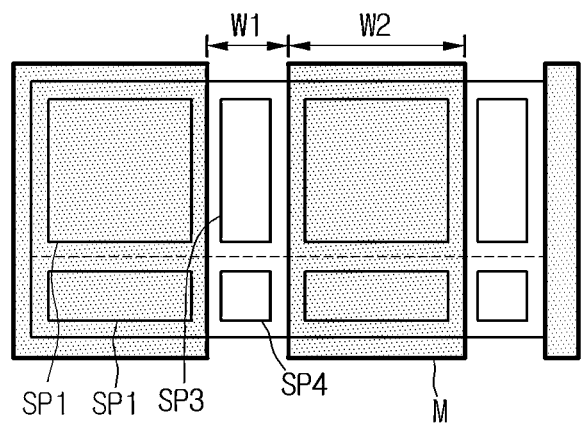
FIG. 9B is a planar view schematically a process of forming a functional layer according to an exemplary embodiment of the present invention.

FIG. 9B is a planar view schematically illustrating a process of forming a functional layer according to an embodiment of the present invention. Referring to FIG. 8B, the OLED device of the present embodiment enables each pixel to include first through fourth sub-pixels arranged in a quad type.

In the OLED device of the present embodiment, the first functional layer used in the display operation of the first sub-pixel SP1 is disposed throughout the entire area including all the plurality of sub-pixels, and the second and third functional layers used in the display operations of the second and third sub-pixels SP2 and SP3 are formed using masks that have stripe openings crossing each other. Thus, the fabrication limitations of a stripe mask M forcing ribs of the mask to be formed in a width of 5~50 μm may be greatly alleviated. In other words, ribs of the masks used for forming the second and third functional layers may have a width corresponding to the horizontal or vertical length of the first sub-pixel region SP1. If the pixel of the present embodiment has the same area as that of the comparable example, the horizontal and vertical lengths of the first sub-pixel SP1 may naturally become larger than the widths of the second and third sub-pixels SP2 and SP3. In other words, the first sub-pixel SP1 may be formed to have a larger area than those of the second and third sub-pixels SP2 and SP3. In accordance therewith, although blue light has lower brightness compared to the other color lights, the first sub-pixel SP1 can emit blue light with sufficient high brightness. Thus, brightness between the sub-pixels may be uniformed.

Also, because the second and third functional layers are formed using the masks that each include the stripe openings crossing each other, they cannot overlap with each other anywhere except for the fourth sub-pixel SP4 even though the stripe openings used for forming the second and third functional layers are misaligned. In other words, the second and third functional layers crossing each other can reduce a margin covering the alignment errors of the masks. Thus, the area of the bank may be reduced, and furthermore the aperture ratio of the OLED device may be enhanced.

A table 1 below compares and illustrates aperture ratios of the sub-pixels according to the present embodiment and the comparable example. The aperture ratios on the table 1 are obtained under conditions in which the pixels of the present embodiment and the comparable example are formed in the same area and the banks of the present embodiment and the comparable example are formed in the width of 24 μm.

TABLE 1

| Item | Embodiment | | Comparable example | |
|---|---|---|---|---|
| Comparison of aperture ratio | $1^{st}:2^{nd}:3^{rd}:4^{th}$ sub-pixel = 2.25:1.5:1.5:1 | | $1^{st}:2^{nd}:3^{rd}:4^{th}$ sub-pixel = 2.25:1.5:1.5:1 | |
| Aperture ratio | $1^{st}$ sub-pixel (width:length = 37:36.5) | 34.3 | $1^{st}$ sub-pixel (width:length = 16.5:86.5) | 35.7 |
| | $2^{nd}$ sub-pixel (width:length = 37:25) | 22.7 | $2^{nd}$ sub-pixel (width:length = 10.5:86.5) | 22.7 |
| | $3^{rd}$ sub-pixel (width:length = 24.5:36.5) | 22.7 | $3^{rd}$ sub-pixel (width:length = 10.5:86.5) | 22.7 |
| | $4^{th}$ sub-pixel (width:length = 25:25) | 15 | $4^{th}$ sub-pixel | 0 |
| | Pixel | 31.5 | Pixel | |

As seen from Table 1, the present embodiment and the comparable example have the same pixel size and similar aperture ratios in each of the first through third sub-pixels, but the present embodiment can further secure the aperture ratio of the fourth sub-pixel compared to the comparable example. In other words, the present embodiment can enhance the aperture ratio, because the first sub-pixel has the largest dimension and the second and third sub-pixels have rectangular shapes progressing in different directions.

Also, as seen from Table 1, it is evident that the widths of the second and third sub-pixels of the present embodiment become wider than those of the comparable example. Thus, the stripe mask used for the present embodiment can have a wider opening compared to that of the comparable example. In accordance therewith, the present embodiment can enhance productivities of each process and the mask and reduce the number of defective products. This results from the fact that productivity of each process is reduced and the mask fabrication is difficult because the decrement of the opening width of a mask causes the limitations of the deposition process.

Figure 10A:
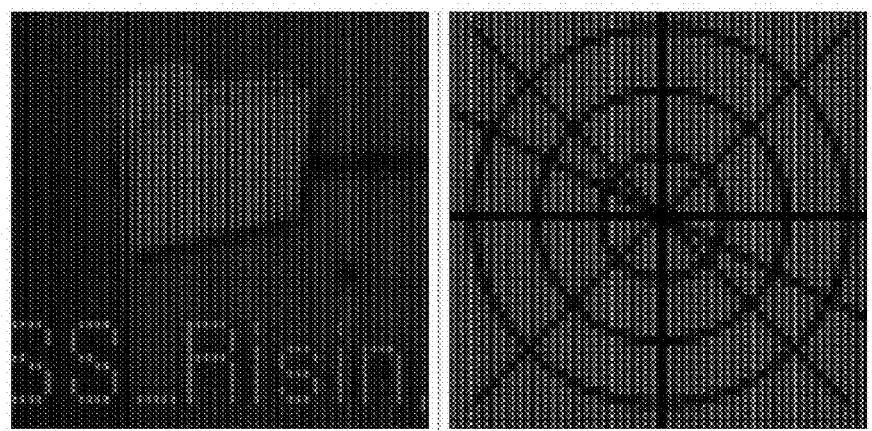
FIGS. 10A and 10B are data sheets illustrating visibilities of the OLED devices according to the comparable example and the exemplary embodiment of the present invention.
Figure 10B:
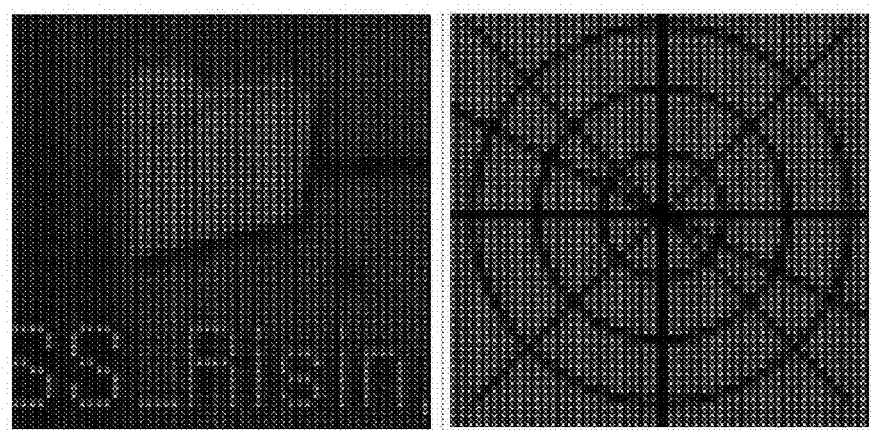

FIGS. 10A and 10B are data sheets visibilities of the OLED devices according to the comparable example and the embodiment of the present invention.

As seen from FIGS. 10A and 10B, it is evident that the OLED devices of the present embodiment and the comparable example are almost equal to each other in visibility (or visual recognizability). In other word, the OLED device of the present embodiment that includes the first sub-pixel with the largest size, the second and third sub-pixels formed in rectangular shapes with major edges of different direction from each other, and the fourth sub-pixel diagonally disposed with respect to the first sub-pixel, can secure almost the same visibility (visual recognizability) as that of the stripe sub-pixel arrangement of the related art. This results from the fact that the positions of the first through fourth sub-pixels within each pixel are fixed and the distances between the sub-pixels are uniform.

Such an OLED device of the present embodiment may have red, green, blue and white sub-pixel by disposing a functional layer emitting one color light on all the sub-pixel regions and crossing two different functional layers emitting different color lights. Thus, the OLED device of the present embodiment can use only two fine metal masks, i.e., only two stripe masks. In accordance therewith, the efficiency of each process and productivity may be enhanced.

Meanwhile, the related art OLED device with the pixel configuration including red, green, blue and white sub-pixels is fabricated using a slot mask that has openings of a sub-pixel unit. The slot mask with several limitations cannot increase the aperture ration may be more difficult to enhance the aperture ratio compared to the stripe mask. However, unlike that of the related art, the OLED device of the present embodiment with the pixel configuration including red, green, blue and white sub-pixels may be fabricated using the stripe masks and enhance the aperture ratio. These results from the fact that the first functional layer is formed on every sub-pixel and the second and third functional layers are formed in crossing relation to each other.

The pixel configuration of including the first sub-pixel with the largest size and the second and third sub-pixels formed in rectangular shapes with major edges of different direction from each other can secure almost the same visibility as the related art stripe format pixel and enhance the aperture ratio. Within the same pixel dimension, the pixel configuration of the present embodiment enables the first through third sub-pixels to maintain almost the same aperture as those of the related art stripe format and additionally provides the formation region of a fourth sub-pixel.

Also, within each pixel region, the formation positions of the first through fourth sub-pixels are fixed and the distances between adjacent sub-pixels are uniform. In accordance therewith, the visibility (or visual recognizability) can be enhanced.

Moreover, the first sub-pixel with the largest dimension is used as a blue sub-pixel emitting blue light that has lower brightness than those of the other color lights. Thus, brightness of blue light can be enhanced. In addition, as the fourth sub-pixel is used as a white sub-pixel, power consumption of the OLED device can be reduced.

Although the present invention has been limitedly explained regarding only the exemplary embodiments described above, it should be understood by the ordinary skilled person in the art that the present invention is not limited to these embodiments, but rather that various changes or modifications thereof are possible without departing from the spirit of the present invention. Accordingly, the scope of the present invention shall be determined only by the appended claims and their equivalents.

What is claimed is:

1. An organic light emitting display device comprising:
    a substrate including first through fourth sub-pixel regions arranged in a quad type;
    a first electrode disposed on each of the first through fourth sub-pixel regions;
    a first functional layer disposed on all the first through fourth sub-pixel regions and configured to emit first color light;
    a second functional layer formed in a stripe shape, which progresses along the second and fourth sub-pixel regions arranged in a row direction, and configured to emit second color light;
    a third functional layer formed in another stripe shape, which progresses along the third and fourth sub-pixel regions arranged in a column direction, and configured to emit third color light;
    a second electrode disposed on the entire surface of the substrate including the first through third functional layers; and
    an electrical charge generation layer disposed under the first functional layer.

2. The organic light emitting display device of claim 1, wherein the first sub-pixel region is formed with a larger dimension than those of the second through fourth sub-pixel regions.

3. The organic light emitting display device of claim 2, wherein the second and third functional layers are each formed in a rectangular shape and cross each other.

4. The organic light emitting display device of claim 2, wherein the first through third functional layers overlap one another in the fourth sub-pixel region so that the fourth sub-pixel region is able to display a white color.

5. The organic light emitting display device of claim 1, further comprising:
    a first sub-functional layer configured to emit the first color light; and
    the electrical charge generation layer disposed on the first sub-functional layer.

6. The organic light emitting display device of claim 1, further comprising:
    first through third sub-functional layers formed in the same structure as the first through third functional layers.

7. The organic light emitting display device of claim 1, wherein the first color light is blue light.

8. The organic light emitting display device of claim 5, further comprising:
    at least one of a sub hole injection layer and a sub hole transport layer that are interposed between the first electrode and the first sub-functional layer.

9. The organic light emitting display device of claim 6, further comprising:
    at least one of a sub hole injection layer and a sub hole transport layer that are interposed between the first electrode and the first sub-functional layer.

10. The organic light emitting display device of claim 5, wherein the electrical charge generation layer includes an N-type electrical-charge generation layer and a P-type electrical-charge generation layer.

* * * * *